United States Patent [19]

Hasegawa

[11] Patent Number: 4,933,298

[45] Date of Patent: Jun. 12, 1990

[54] METHOD OF MAKING HIGH SPEED SEMICONDUCTOR DEVICE HAVING A SILICON-ON-INSULATOR STRUCTURE

[75] Inventor: Mitsuhiko Hasegawa, Muranishi, Japan

[73] Assignee: Fujitsu Limited, Kawasaki, Japan

[21] Appl. No.: 286,290

[22] Filed: Dec. 19, 1988

[30] Foreign Application Priority Data

Dec. 18, 1987 [JP] Japan .................. 62-321808

[51] Int. Cl.[5] .................. H01L 21/76; H01L 21/95
[52] U.S. Cl. .................. 437/62; 437/29; 437/40; 437/57; 437/89; 437/99; 437/173; 437/228
[58] Field of Search .................. 437/89, 99, 174, 173, 437/29, 40, 41, 62, 82, 83, 228; 357/40, 23.7

[56] References Cited

U.S. PATENT DOCUMENTS

| | | | |
|---|---|---|---|
| 3,745,072 | 7/1973 | Scott, Jr. .................. | 437/62 |
| 3,791,024 | 2/1974 | Boleky, III .................. | 357/51 |
| 4,412,868 | 11/1983 | Brown et al. .................. | 437/89 |
| 4,566,914 | 1/1986 | Hall .................. | 437/89 |
| 4,615,762 | 10/1986 | Jastrzebski et al. .................. | 437/89 |
| 4,768,076 | 8/1988 | Aoki et al. .................. | 437/173 |

FOREIGN PATENT DOCUMENTS

| | | | |
|---|---|---|---|
| 0115557 | 9/1981 | Japan .................. | 437/99 |
| 0059818 | 3/1986 | Japan .................. | 437/99 |

*Primary Examiner*—Brian E. Hearn
*Assistant Examiner*—T. Thomas
*Attorney, Agent, or Firm*—Staas & Halsey

[57] ABSTRACT

A CMOS silicon-on-insulation structure is fabricated by first forming an insulating $SiO_2$ layer on a silicon substrate having a (110) plane. Openings are then formed in the $SiO_2$ layer to expose a part of the substrate, and a polycrystalline or an amorphous silicon layer is deposited on the $SiO_2$ layer and in the openings. The deposited silicon layer is divided into islands so that a first island includes one of the openings and a second island does not include any openings. A laser beam is then irradiated onto the islands so as to melt the islands, and when the laser light irradiation is discontinued, the melted islands recrystallize so that the first island forms a (110) plane and the second island forms a (100) plane. A p-channel MOSFET is fabricated on the first island, and an n-channel MOSFET is fabricated on the second island. The thus paired CMOS operates at high speeds, because the p-channel MOSFET using positive holes as the carrier is fast in a (110) crystal, and the n-channel MOSFET using electrons as the carrier is fast in a (100) crystal.

17 Claims, 5 Drawing Sheets

METHOD OF MAKING HIGH SPEED SEMICONDUCTOR DEVICE HAVING A SILICON-ON-INSULATOR STRUCTURE

BACKGROUND OF THE INVENTION

1. Field of the Invention

This invention relates to a high speed semiconductor device and a method of fabricating the semiconductor device, and more particularly to a high speed CMOS (complementary metal oxide semiconductor) device having an SOI (silicon-on-insulator) structure and its method of fabrication.

2. Description of the Related Art

Extensive efforts have been made to enhance the operating speed of semiconductor devices. One way to increase the operating speed is to increase the mobility of carriers in a semiconductor material. It is well known that the mobility of a carrier depends on its crystal orientation, i.e. Miller indices of its plane. Typical values of the field effect mobility (referred to hereinafter as mobility) of two kinds of carriers in silicon of two different crystal orientations are compared below. The data are for silicon doped with an impurity, the impurity being arsenic in a p-type substrate and boron in an n-type substrate in concentrations as much as $10^{14}$ cm$^{-3}$–$10^{15}$ cm$^{-3}$, respectively. The mobility of the carriers in the following table is given in cm$^2$V$^{-1}$sec$^{-1}$:

| Miller Indices | Carrier: Electron | Positive Hole |
|---|---|---|
| (100) | 450 | 150 |
| (110) | <400 | 190 |

Thus, it is seen that the mobility of a positive hole in a silicon substrate having a (100) plane is only one third that of an electron. Therefore, a channel width of an FET (field effect transistor) using positive holes must be three times larger than that for electrons if the current capacity is to be kept equal to that for an FET using electrons. As integration density is always a concern, it is clear that such channel widths would not be advantageous for enhanced integration density.

Therefore, it has been proposed to employ a (100) plane for an n-channel MOSFET which uses electrons as its carrier and a (110) plane for a p-channel MOSFET which uses positive holes as its carrier. An example of one such proposal is reported in "Submicron 3D Surface Orientation Optimized CMOS Technology" by Kinugawa, et al., which was presented at the Symposium On VLSI Technology, held in San Diego, Calif., on May 28–30, 1986. The structure reported therein is schematically illustrated in FIG. 1. An n-channel MOSFET is fabricated on a (100) surface of a silicon substrate, and a p-channel MOSFET is fabricated on a surface having a (110) plane cut vertically to the (100) surface. Another proposed CMOS structure is disclosed by Kasai in Japanese unexamined patent publication Tokukai Sho 63-80561. In this structure, side planes cut vertically to the substrate surfaces are used to form transistors as well.

However, there are problems in these proposed structures. First, the fabrication processes, particularly the photolithography processes, are quite complicated due to the employment of the vertically cut surfaces. Furthermore, another problem is that in these structures a parasitic thyristor causes a latch-up phenomena between the p-type FET and the n-type FET.

In order to avoid the problems associated with vertically cut surfaces, the present inventor has proposed a partial SOI structure as shown in FIG. 2. Directly on an n-type silicon substrate 1 having a (110) plane, a p-channel MOSFET is fabricated. The p-channel MOSFET is composed of p-type source and drain regions 18 and 19, an insulating SiO$_2$ layer 16 as a gate insulating layer, a gate electrode 17, a passivating PSG (phospho-silicate glass) layer 24 and source and drain electrodes 25a and 25b. An n-channel MOSFET of SOI structure is composed of a p-type silicon island 15 having a (100) plane, formed on an SiO$_2$ layer 2, n-type source and drain regions 22 and 23 locally formed in the silicon island 15, an insulating SiO$_2$ layer 20 forming a gate insulating layer, a silicon gate electrode 21, the passivating PSG layer 24, and source and drain electrodes 25c and 25d. However, an advantage of an SOI structure, that the isolation process can be carried out by only an etching process, is not enjoyed in this structure.

SUMMARY OF THE INVENTION

A general object of the present invention is to provide a high speed CMOS transistor.

Another object of the invention is to provide a CMOS of a fully SOI structure having no latch-up effect.

Still another object of the invention is to provide a simple and reliable method for fabricating an SOI CMOS device.

According to the present invention, an insulating layer is formed on a silicon substrate having a (110) plane. An opening is then made in the formed insulating layer so as to expose a part of the substrate, and a polycrystalline or amorphous silicon layer is deposited on the insulation layer and in the opening. The deposited silicon layer is divided into a plurality of islands such that a first one of the islands contacts the substrate through the opening and a second one of the islands is isolated from the substrate. The islands are then heated until they melt and are subsequently cooled, and the first island is recrystallized to form a (110) plane and the second island is recrystallized to form a (100) plane. A p-channel MOSFET is formed on the first island and an n-channel MOSFET on the second island.

The above-mentioned features and advantages of the present invention, together with other objects and advantages, which will become apparent, will be more fully described hereinafter, reference being had to the accompanying drawings forming a part hereof, wherein like numerals refer to like parts throughout.

DESCRIPTION OF THE PREFERRED EMBODIMENTS

Referring to FIGS. 3 and 4, the process steps of the present invention are hereinafter described.

Figure 1:
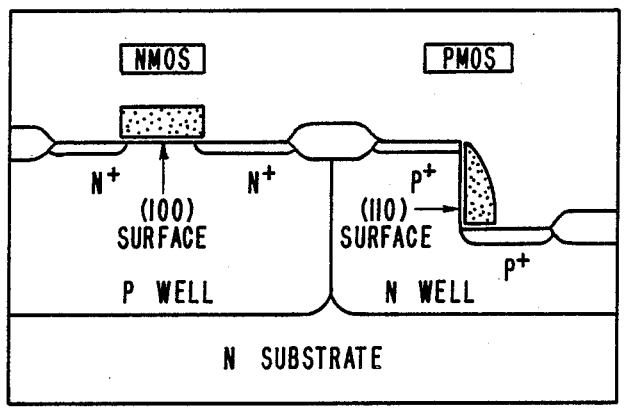
FIG. 1 is a cross-sectional side view of a prior art three-dimensional surface orientation optimized CMOS structure utilizing a vertical cut of the substrate.
Figure 2:
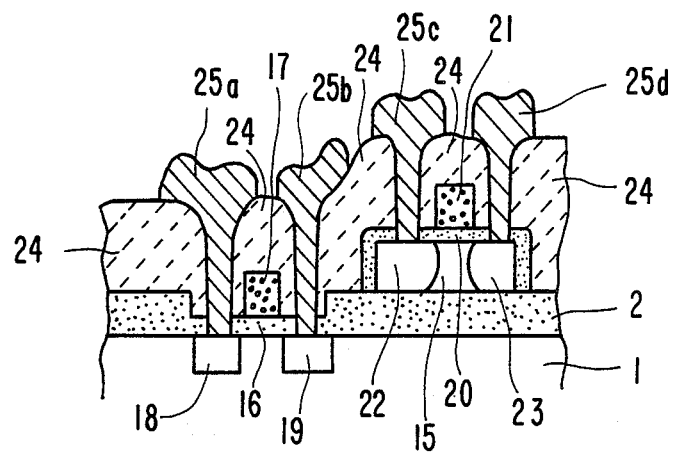
FIG. 2 is a cross-sectional side view of a prior art CMOS structure partially employing an SOI structure.
Figure 3A:
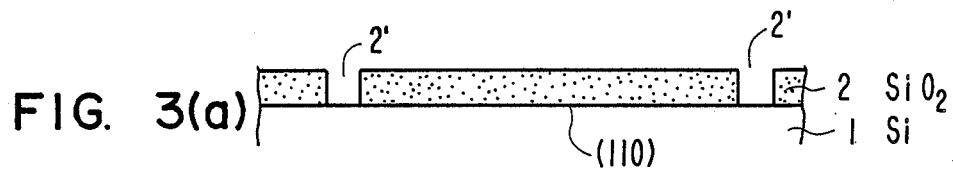
FIGS. 3(a)–(h) schematically illustrate cross-sectional side views showing fabrication steps of a fully SOI CMOS according to the present invention.

On a silicon substrate 1 (of either n or p-type) having a (110) plane, an $SiO_2$ (silicon dioxide) insulating layer 2 is formed as thick as approximately 1 μm by thermal oxidization of the substrate 1. Openings 2' of typically 4 μm square and at least 0.7 μm diameter are etched in the $SiO_2$ layer 2 by a known lithography technique, i.e. patterning a photoresist thereon and reactive ion etching (RIE) using, for example, $CHF_3$ (methane trifluoride) gas, so that a part of the (110) substrate 1 is exposed, as shown in FIG. 3(a).

Figure 3B:
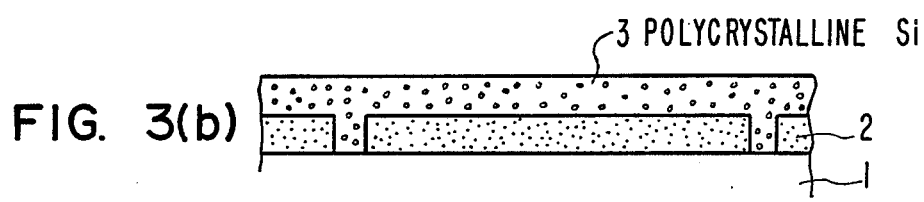

Next, as shown in FIG. 3(b), a polycrystalline silicon layer 3 is deposited over the entire $SiO_2$ layer 2, including the openings 2', by a conventional CVD (chemical vapor deposition) method. The silicon layer 3 can be as thick as approximately 4000 Å. Instead of polycrystalline silicon, the same thickness of amorphous silicon may be deposited as the layer 3, using, for example, a conventional sputtering method.

Figure 3C:
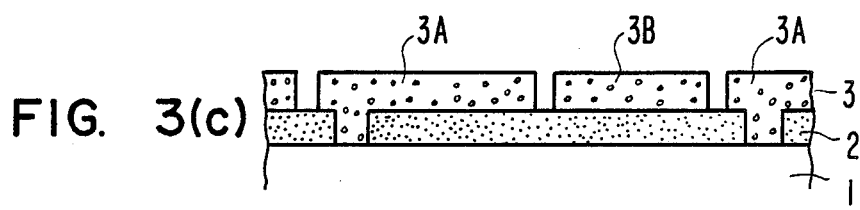
Figure 4A:
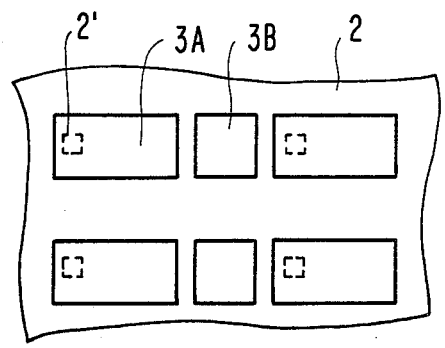
FIGS. 4(a) and (b) schematically illustrate plan views corresponding to the fabrication steps illustrated in FIGS. 3(c) and 3(g)

Next, the deposited silicon layer 3 is patterned for division into a plurality of islands by a conventional photolithography technique. For example, a photoresist film is patterned on the deposited silicon layer 3 to cover the portions of the silicon layer 3 to remain as the islands. The silicon layer 3 is then exposed, and the exposed portions of the silicon layer 3 are removed by a known wet etching method using, for example, a mixture of hydrofluoric acid and nitric acid. In this way, the isolated islands are formed. The layout of the divided islands is as follows. A first island 3A, on which a (110) plane will be formed afterwards, is patterned so that the island 3A extends into and includes the silicon deposited one of the openings 2'. A second island 3B, on which a (100) plane will be formed afterwards, is patterned so that the island 3B does not extend into any of the openings 2'. First and second islands 3A and 3B, which are generally located adjacent to each other, form a pair in a CMOS device. This structure is shown in FIG. 3(c) and FIG. 4(a).

Figure 3D:
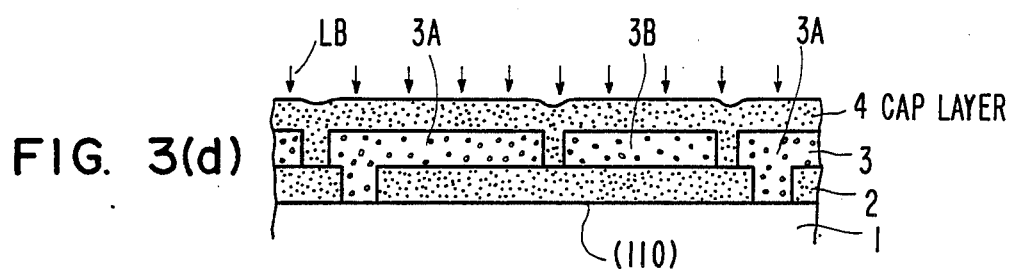

Next a cap layer 4, generally composed of an approximately 5000 Å thick $SiO_2$ film and an approximately 300 Å thick $Si_3N_4$ (silicon nitride) film thereon, is formed over the islands 3A and 3B as shown in FIG. 3(d). Both the $SiO_2$ film and the $Si_3N_4$ film are formed using a conventional CVD method. The cap layer 4 reduces from 85% to 60%–70% the percentage of laser light reflected from the surface of the structure when laser light is irradiated onto the structure.

Figure 3E:
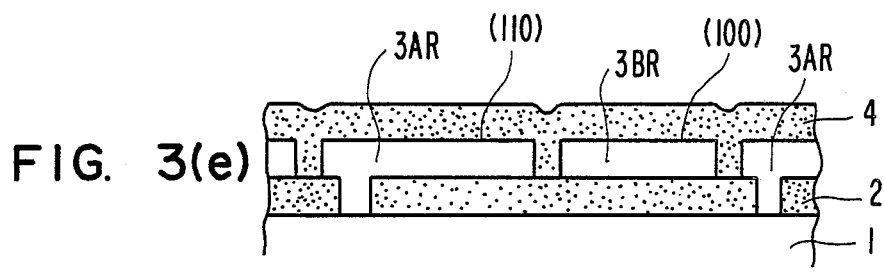

Next, the substrate 1 is heated up to approximately 450° C. using a conventional heating apparatus, such as an electric heater (not shown). At the same time, a laser light beam LB having a wavelength of approximately 500 nm, which is easily absorbed by silicon, is generated by a continuous wave argon gas laser and irradiated onto the islands 3A and 3B through the cap layer 4. Typically, the laser to be used has an output of 15 watts, a beam spot size of approximately 40 μm and a scanning speed of approximately 15 cm/sec. The laser beam LB causes the deposited silicon forming the islands 3A and 3B to melt. When the laser light irradiation is finished, the substrate 1 is allowed to cool down while keeping the heater on, so that the melted first island 3A recrystallizes. When the melted silicon island 3A recrystallizes, the substrate 1 (which has a (110) plane) contacting the melted silicon island 3A acts as a seed to grow a single crystal having a (110) plane. Accordingly, when the melted first island 3A recrystallizes, a single crystal 3AR having the same (110) plane is formed. However, the melted second silicon island 3B is separated from the substrate 1 and has no seed. Therefore, when the melted second island 3B recrystallizes, a single crystal grows so as to have the least surface potential energy in regard to the underlying insulating layer, which is a (100) plane. Accordingly, when the melted second island 3B crystallizes, a single crystal island 3BR having a (100) lane is formed. This structure is illustrated in FIG. 3(e).

Figure 3F:
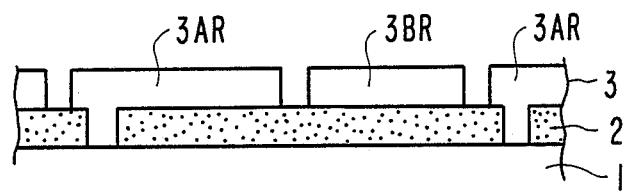

Next, the cap layer 4 is removed, as indicated in FIG. 3(f). First, the $Si_3N_4$ film is removed by a conventional wet etching method, using, for example, a phosphorous acid solution. The underlying $SiO_2$ film of the cap layer 4 is also removed by a conventional wet etching method which uses, for example, a hydrofluoric acid solution.

Figure 3G:
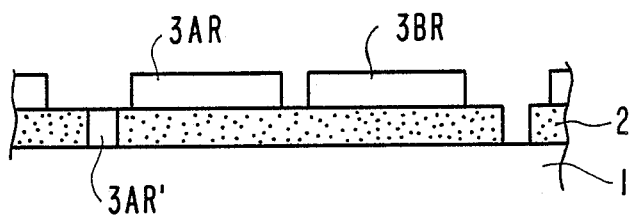
Figure 4B:
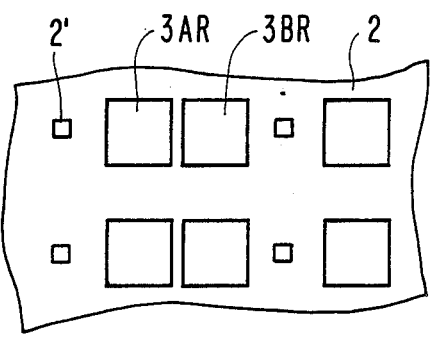
FIG. 4(c) schematically illustrates a plan view of a second embodiment of the present invention obtained by modifying the fabrication steps illustrated in FIGS. 3(c) and (g)

The outcome of the next fabrication step is illustrated in FIGS. 3(g) and 4(b). In this step, the seed portion, that is, a portion of the first island 3AR including the opening 2', is separated from the main portion of the island 3AR by using a conventional photolithography technique. More particularly, a photoresist is patterned over the first island 3AR (and second island 3BR) so as to expose a portion of the first island 3AR to be removed. Then, the exposed portion of the island 3AR, generally excepting the portion 3AR' within the opening 2' itself, is removed by using a conventional wet etching method which uses, for example, a mixture of hydrofluoric acid and nitric acid.

Figure 3H:
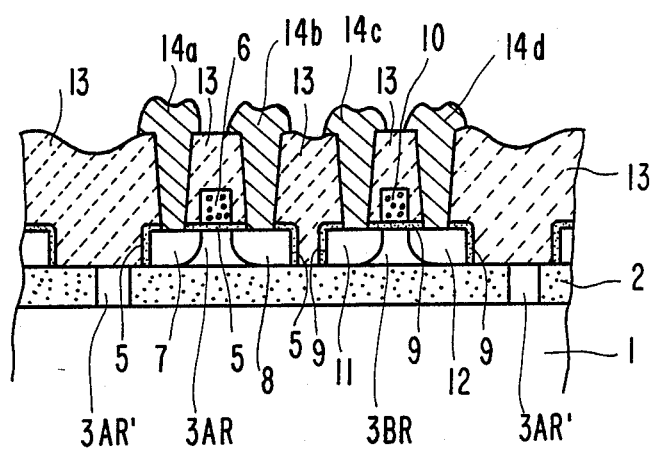

A p-channel MOSFET is then fabricated in the first island 3AR having a (110) plane, and an n-channel MOSFET is fabricated in the second island 3BR, by known techniques. These two MOSFETs are complementary. Referring to a completed CMOS structure shown in FIG. 3(h), details of the fabrication processes are described hereinafter. The first island 3AR is doped with an n-type dopant. The dopant can be arsenic, and the concentration can be as much as, for example, approximately $10 \times 10^{17}$ cm$^{-3}$. The second island 3BR is doped with a p-type dopant, such as boron. The concentration of the p-type dopant can also be as much as, for example, approximately $10 \times 10^{17}$ cm$^{-3}$. $SiO_2$ insulating layers 5 and 9 are formed on the thus doped islands 3AR and 3BR, by oxidization thereof, to form gate insulating layers 5 and 9. Next, gate electrodes 6 and 10 are formed on the $SiO_2$ gate insulating layers 5 and 9, respectively, with a deposition of heavily doped silicon, as much as approximately $10-10^{-12}$ cm$^{-2}$ in dose. Then a p-type dopant, such as boron and having a dose of as much as approximately $3 \times 10^{-15}$ cm$^{-2}$, is ion-implanted into source and drain regions 7 and 8 in the first island 3AR so as to form p-type regions. Next, an n-type dopant, such as arsenic, is ion-implanted into source and drain regions 11 and 12 in the second island 3BR, the dose being as much as approximately $3 \times 10^{-15}$ cm$^{-2}$, so as to form n-type regions. An insulating $SiO_2$ layer 13 is deposited all over the wafer. The $SiO_2$ layers 5, 9 and 13 are locally etched to form windows which expose a part of each source and drain region. Next, aluminum electrodes 14a, 14b, 14c and 14d are patterned on the SiO$_2$ layer 13 so as to form leads to the drain and source regions 7, 8, 11 and 12, respectively, through the windows. In this way, adjoining MOSFETs are formed, as shown in FIG. 3(h).

Although not shown in the figures, a plurality of MOSFETs may be fabricated in a single island so that the integration density can be increased.

Figure 4C:
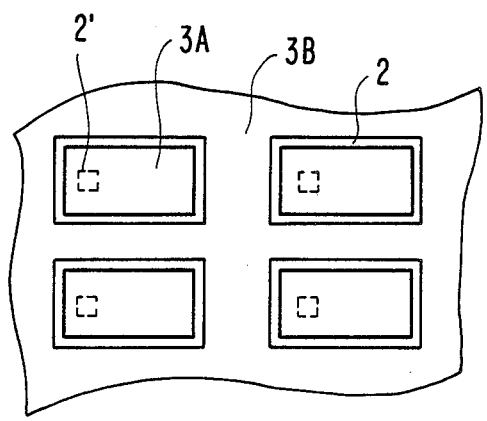

Though in the above-described preferred embodiment the seed portion 3AR' is separated from the main portion 3AR of the island, the seed portion 3AR need not necessarily be separated from the main portion of the island 3AR. If the seed portion 3AR' is not separated, the area for the seed portion can be saved so as to increase the integration density, as shown in FIG. 4(c). However, the substrate potential of the p-channel MOSFET is kept at a ground voltage. Accordingly, the stray capacitance of the p-channel MOSFET is increased to lower the operation speed.

According to the present invention, each MOSFET in the complementary pair is formed in the silicon island of crystal orientation having higher mobility for each carrier. In this way, a high speed operation is achieved. It is also advantageous that the recrystallization process can be carried out for both of the planes (100) and (110) by a single laser irradiation step. Furthermore, the complete insulation between the complementary FETs is advantageous, as it prevents the latch-up effect from occurring therebetween.

When the silicon islands recrystallize, the structure must be that of a single crystal, i.e., free from a grain-boundary, which deteriorates the operation of transistors fabricated thereon. In order to make the islands 3AR or 3BR free from a grain boundary, it is preferable to employ an improved method, which is the subject of U.S. patent application Ser. No. 203,633, filed June 6, 1988, the disclosure of which is hereby incorporated by reference, which is a continuation application of U.S. patent application Ser. No. 937,412, filed Dec. 12, 1986, now abandoned. This use of this method in the fabricating steps for the present invention is hereinafter described referring to FIGS. 5 and 6.

Figure 5A:
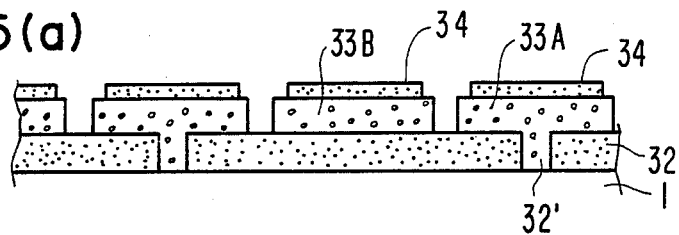
FIGS. 5(a)–(d) schematically illustrate cross-sectional side views showing additional fabrication steps to those of FIG. 3.
Figure 5B:
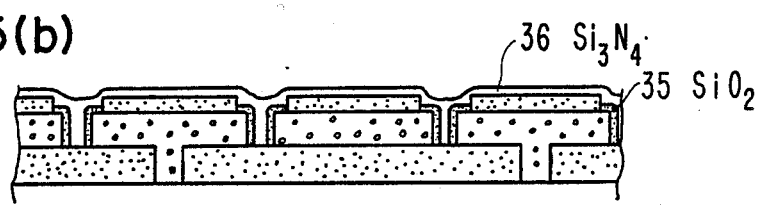
Figure 5C:
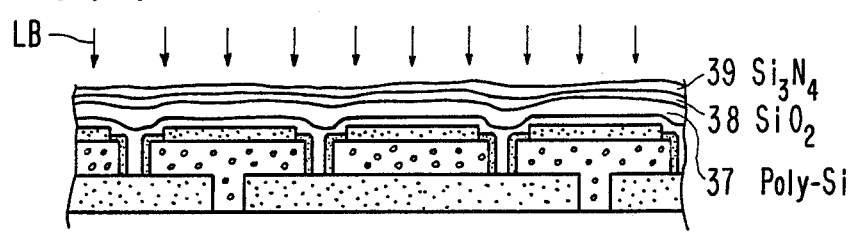
Figure 6:
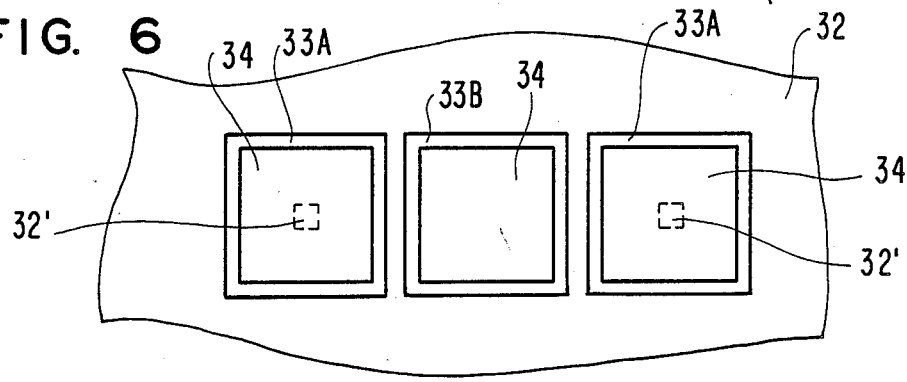
FIG. 6 schematically illustrates plan view corresponding to the fabrication step illustrated in FIG. 5(a).

As illustrated in FIG. 5(a), an opening 32' in an SiO$_2$ layer 32 is located beneath the center of a polycrystalline or amorphous silicon first island 33A. The opening 32' is typically 4 μm square, and the sides of first and second islands 33A and 33B, which are generally square, are, for example, approximately 5 μm longer on each side than the sides of a complete single crystal portion to be obtained therefrom (also generally square). One desirable dimension for the single crystal portion to be obtained is approximately 20 μm×20 μm. On the surfaces of the polycrystalline or amorphous silicon islands 33A and 33B, an approximately 4000 Å thick SiO$_2$ layer 34 is deposited by using a conventional CVD technique. Next, the SiO$_2$ layer 34 is patterned so that portions other than those above the complete single crystal portion to be obtained from the islands are removed. This is accomplished by using a conventional method, such as using a photoresist and RIE with a CHF$_3$ gas, to obtain the result shown in FIGS. 5(a) and 6. Next, the thus exposed portions of the silicon islands are thermally oxidized to form an approximately 300 Å SiO$_2$ film 35 thereon. An approximately 800 Å thick Si$_2$N$_4$ film 36 is then deposited on the patterned SiO$_2$ layer 34 and the SiO$_2$ film 35. The structure of the wafer at this point is shown in FIG. 5(b). On the deposited Si$_3$N$_4$ film 36, an approximately 7000 Å thick polycrystalline or amorphous silicon layer 37 is deposited, using a known CVD method. On the deposited silicon layer 37, an approximately 300 Å thick SiO$_2$ film 38 and an approximately 300 Å thick Si$_3$N$_4$ film 39 are deposited using the same methods as those mentioned above. The state of the wafer at this point is shown in FIG. 5(c).

Figure 5D:
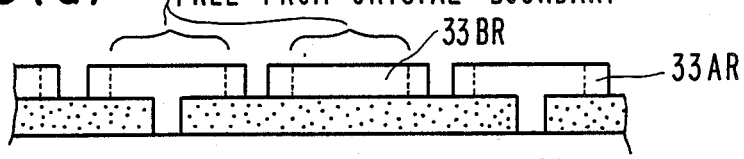

The films 38 and 39 reduce reflection of a laser light beam LB to be irradiated onto the structure in a way similar to that for the cap layer 4 discussed above. Next, while the substrate 1 is heated to approximately 450° C. with an electric heater, an argon laser light beam LB, having an approximately 100 μm beam spot, a 13–15 watt output, and an approximately 2.5 cm/sec scanning speed, is irradiated through the layers 38 and 39 into the silicon layer 37. The silicon layer 37 absorbs the energy of the argon laser light, which results in the silicon layer 37 being melted. Consequently, the islands 33A and 33B are melted by the heat conducted from the melted silicon 37 through the SiO$_2$ layers 34 and 35. Because the centrally located SiO$_2$ layer 34 is thicker than the peripherally located SiO$_2$ film 35, the center portions of the islands 33A and 33B are slow to melt. In other words, the temperature in the center portion under the relatively thick SiO$_2$ layer 34 is lower than the temperature in the peripheral portion under the thinner SiO$_2$ film 35. Accordingly, when the melted silicon recrystallizes to form islands 33AR and 33BR, the recrystallization takes place at the center portion first, and then extends to the peripheral portion. Preferably, the seed portion 32' is located under the center of the island 33A in order to initiate the crystal growth from the center. Owing to this recrystallization process, no crystal boundary is produced in the central portion of the islands 33AR and 33BR. Even if a crystal boundary is produced, it will only be in the peripheral portions. This state is shown in FIG. 5(d).

Next, the films and layers 39, 38, 37, 36, 35 and 34 are removed, using the same methods described in regard to the cap layer 4 of FIG. 3. On the thus exposed boundary-free crystal portions of the islands 33AR and 33BR, the FETs are fabricated in the same way described above for the first preferred embodiment. Because thus fabricated MOSFETs are on a perfect single crystal, i.e., a crystal having no crystal boundary, MOSFETs of uniform characteristics can be fabricated with high production yield.

Though in the figures, the final islands are drawn as square and symmetrical for the (110) island and the (100) island, the islands may be of any shape, including any asymmetric shape, in accordance with the design requirement.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not desired to limit the invention to the exact construction and operation shown and described, and accordingly, all suitable modifications are equivalents may be resorted to, falling within the scope of the invention.

What I claim is:

1. A method of fabricating a semiconductor device, comprising the steps of:
   (a) forming an insulating layer on a silicon substrate having a (110) surface plane;

(b) forming an opening in the insulating layer so as to expose a part of the substrate;

(c) depositing a silicon layer on the insulating layer and the exposed part of the substrate;

(d) dividing the deposited silicon layer into first and second islands, the first island contacting the substrate through the opening and the second island being isolated from the substrate;

(e) recrystallizing the first island to form a (110) plane and the second island to form a (100) plane;

(f) forming a p-channel field effect transistor on the recrystallized first island; and (g) forming an n-channel field effect transistor on the recrystallized second island.

2. A method of fabricating a semiconductor device according to claim 1, wherein said step (c) comprises depositing amorphous silicon.

3. A method of fabricating a semiconductor device according to claim 1, wherein said step (c) comprises depositing polycrystalline silicon.

4. A method of fabricating a semiconductor device according to claim 1, wherein said step (e) comprises the substeps of:

(i) irradiating a light beam onto the plurality of islands so as to melt the islands; and (ii) discontinuing the irradiating of the light beam onto the islands so as to allow the melted islands to cool and recrystallize.

5. A method of fabricating a semiconductor device according to claim 1, further comprising, after said step (d), the step of:

(h) depositing a cap layer on the first and second islands to reduce reflection of light irradiated thereon.

6. A method of fabricating a semiconductor device according to claim 5, wherein said step (h) comprises depositing a silicon dioxide layer and a silicon nitride layer.

7. A method of fabricating a semiconductor device according to claim 1, further comprising, after said step (e), the step of:

(i) selectively removing a portion of the first island, the portion including the silicon above the opening.

8. A method of fabricating a semiconductor device, comprising the steps of:

(a) forming an insulating layer on a silicon substrate having a (110) surface plane;

(b) forming openings in the insulating layer to expose portions of the substrate therethrough;

(c) depositing a silicon layer on the insulating layer and the exposed portions of the substrate;

(d) dividing the deposited silicon layer into a plurality of first islands which include at least one of the openings and a plurality of second islands which include none of the openings;

(e) melting and recrystallizing the first and second islands;

(f) forming a p-channel field effect transistor on the recrystallized first islands; and (g) forming n-channel field effect transistors on the recrystallized second islands.

9. A method of fabricating a semiconductor device according to claim 8, wherein said step (e) comprises the substeps of:

(i) heating the substrate;

(ii) irradiating the islands with a laser beam; and (iii) cooling the islands so that each of the first islands recrystallize into a single crystal having a (110) plane, and each of the second islands recrystallize into a single crystal having a (110) plane.

10. A method of fabricating a semiconductor device according to claim 8, further comprising, after said step (d), the step of:

(h) depositing a cap layer on the first and second islands to reduce reflection of the laser beams.

11. A method of fabricating a semiconductor device according to claim 10, wherein the cap layer includes a silicon dioxide layer and a silicon nitride layer.

12. A method of fabricating a semiconductor device, comprising the steps of:

(a) forming an insulating layer on a silicon substrate having first surface plane indices;

(b) forming an opening in the insulating layer so as (c) forming first and second silicon islands on the insulating layer, the first island being connected to the substrate through the opening and the second layer being isolated from the substrate;

(d) recrystallizing the first island to form the first surface plane indices therein and the second island to form second surface plane indices therein;

(e) forming a first-type field effect transistor on the recrystallized first island; and (f) forming a second-type field effect transistor, opposite in polarity from the first-type field effect transistor, on the recrystallized second island.

13. A method of fabricating a semiconductor device according to claim 12, wherein said step (c) further comprises forming the islands from amorphous silicon.

14. A method of fabricating a semiconductor device according to claim 12, wherein said step (c) further comprises forming the islands from polycrystalline silicon.

15. A method of fabricating a semiconductor device according to claim 12, further comprising, after said step (c), the step of:

(g) depositing a cap layer on the first and second islands.

16. A method of fabricating a semiconductor device according to claim 15, wherein said step (d) comprises the substeps of:

(i) irradiating a light beam onto the cap layer so as to melt the islands; and (ii) discontinuing the irradiating of the light beam onto the cap layer so as to allow the melted islands to cool and recrystallize.

17. A method of fabricating a semiconductor device according to claim 15, wherein said step (g) comprises depositing a silicon dioxide layer and a silicon nitride layer.

* * * * *